United States Patent [19]

Blaum et al.

[11] Patent Number: 5,280,533
[45] Date of Patent: Jan. 18, 1994

[54] CODING METHOD FOR SKEWED TRANSITION CORRECTION IN PARALLEL ASYNCHRONOUS COMMUNICATION SYSTEMS

[75] Inventors: Miguel M. Blaum, San Jose; Jehoshua Bruck, Palo Alto, both of Calif.

[73] Assignee: International Business Machines Corporation, Armonk, N.Y.

[21] Appl. No.: 715,522

[22] Filed: Jun. 14, 1991

[51] Int. Cl.$^5$ .............................................. G06F 11/10
[52] U.S. Cl. ......................................... 371/1; 371/37.1
[58] Field of Search .................................... 371/1, 37.1

[56] References Cited

U.S. PATENT DOCUMENTS

| | | | |
|---|---|---|---|
| 4,656,634 | 4/1987 | Lombardi et al. | 371/1 |
| 4,691,319 | 9/1987 | Bose et al. | 371/54 |
| 4,908,827 | 3/1990 | Gates | 371/43 |
| 4,980,897 | 12/1990 | Decker et al. | 371/43 |
| 5,208,816 | 5/1993 | Seshardi et al. | 371/43 |

OTHER PUBLICATIONS

T. Verhoeff, Delay-Insensitive Codes-An Overview, Distributed Computing, vol. 3, pp. 1-8, 1988.
Blaum et al., On t-Error Correcting/All Unidirectional Error Detecting Codes, IEEE Transactions on Computers, vol., C38, pp. 1493-1501, Nov. 1989.
Berger, A Note on Error Detection Codes for Asymetric Channels, Information and Control, vol. 4, pp. 68-73, 1961.

*Primary Examiner*—Charles E. Atkinson
*Attorney, Agent, or Firm*—Henry E. Otto, Jr.

[57] ABSTRACT

An algorithm for a ($t_1$, $t_2$)-tolerant code, and a method and apparatus for decoding same, for tolerating and detecting skewed transitions in a parallel asynchronous communication system without acknowledgement. Transitions sent at the same time in a parallel channel may arrive at different times, but the algorithm permits a limited degree of variation in transmission speeds between channels. Errors will be corrected and transmissions will be continuous as long as the values of $t_1$ or $t_2$ for the algorithm, as preselected by the user, are not exceeded. If they are exceeded, a desired control operation will generally be initiated. $t_1$ is the maximum number of transmissions that may be missing from a first transmitted codeword when a transmission arrives from a second transmitted codeword, and $t_2$ is the maximum number of transitions from the second codeword that may arrive before all transitions of the first codeword arrive.

8 Claims, 4 Drawing Sheets

CODING METHOD FOR SKEWED TRANSITION CORRECTION IN PARALLEL ASYNCHRONOUS COMMUNICATION SYSTEMS

CROSS REFERENCE TO RELATED APPLICATIONS

[A] U.S. Ser. No. 07/715,524, filed concurrently herewith by Blaum and Bruck, entitled "Method and Apparatus for Encoding and Decoding Unordered Error Correcting Codes"; and

[B] U.S. Ser. No. 07/715,279, filed concurrently herewith by Blaum and Bruck, entitled "Coding Method for Skewed Transition Detection in Parallel Asynchronous Communication Systems".

FIELD OF THE INVENTION

This invention relates to a coding method and apparatus which tolerates and corrects up to a preselected number of skewed transitions in transmissions in parallel asynchronous communication systems which do not require acknowledgement signals being sent back to the transmitter and permits continuous pipeline operation so long as said preselected number is not exceeded.

BACKGROUND OF THE INVENTION

If a communication system which consists of many parallel channels operates asynchronously and without acknowledgement, there is neither a clock signal received by the receiver nor an acknowledgement signal sent back to the transmitter. Each transmission consists of one or more transitions (i.e., "1" bits) which are transmitted at the same time. If the information bits from different channels do not arrive at the same time (e.g., because of a delay in one or more channels), the receiver may receive some "1" bits corresponding to a next transmission before the present transmission has been completed, a condition referred to as "skew".

A paper by T. Verhoeff entitled "Delay-insensitive Codes—An Overview", published in Distributed Computing, Vol. 3, pp. 1-8, 1988, suggests the use in a parallel asynchronous communication system of unordered vectors because they are "delay insensitive". However, the parallel asynchronous communication system he describes requires that an acknowledgement signal be sent by the receiver to the transmitter upon completion of each transmission and he does not disclose or suggest the use of vectors with Hamming distance properties which are unordered.

The above-identified related application [B] discloses a method for detecting (but not correcting) skewed transitions resulting from transitions from one transmission being intermixed with transitions of another transmission.

To fully understand unordered codes, it is best to consider an example. For a binary vector u of length n, $u = u_1, u_2, \ldots, u_n$. The set of non-zero bits of vector u are hereafter referred to as the "support" of u. For instance, for $n=6$, if $u=100101$, the support of u is the set $\{1,4,6\}$. Two vectors u and v of length n are considered unordered when their supports are unordered as sets; i.e., neither of them contains the other. Thus, $u=100101$ and $v=010101$ are unordered because their corresponding supports are $\{1,4,6\}$ and $\{2,4,6\}$. By contrast, the vector $w=000101$ which has a support of $\{4,6\}$ would not be unordered relative to either u or v because its support $\{4,6\}$ is a subset of the support of both u and v.

There is a need for a parallel asynchronous communication system which not only does not require acknowledgement between the receiver and transmitter when a transmission is completed, but also tolerates and corrects up to a preselected number of skewed transitions to permit continuous pipeline operation.

SUMMARY OF THE INVENTION

An algorithm for a $(t_1,t_2)$-tolerant code, and a method and apparatus for decoding same, for tolerating and detecting skewed transitions in a parallel asynchronous communication system without acknowledgement. Transitions sent at the same time in a parallel channel may arrive at different times, but the algorithm permits a limited degree of variation in transmission speeds between channels.

Errors will be corrected and transmissions will be continuous as long as the values of $t_1$ or $t_2$ for the algorithm, as preselected by the user, are not exceeded. If they are exceeded, a desired control operation will generally be initiated. $t_1$ is the maximum number of transmissions that may be missing from a first transmitted codeword when a transmission arrives from a second transmitted codeword, and $t_2$ is the maximum number of transitions from the second codeword that may arrive before all transitions of the first codeword arrive.

The $(t_1,t_2)$-tolerant code is constructed by selecting, for a $(t_1,t_2)$-tolerant code, codewords constituting a set in which at least one of the following conditions occurs for each arbitrary pair of codewords X and Y in the set:
(a) $\min\{N(X,Y), N(Y,X)\} \geq t+1$, or
(b) $\min\{N(X,Y), N(Y,X)\} \geq 1$ and $\max\{N(X,Y), N(Y,X)\} \geq t_1+t_2+1$,
where $t = \min(t_1,t_2)$.

DESCRIPTION OF THE PREFERRED EMBODIMENT

Figure 1:
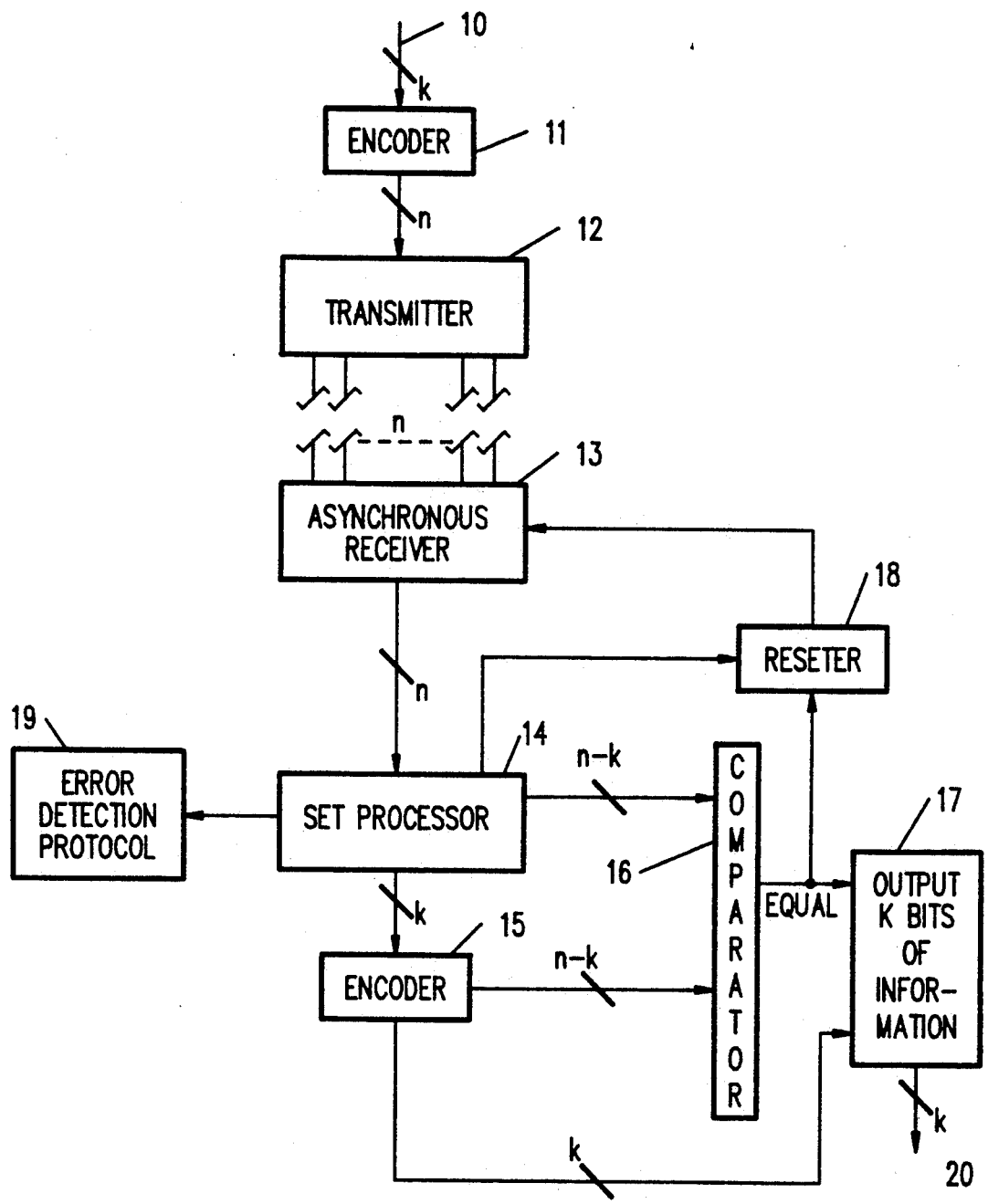
FIG. 1 depicts a parallel asynchronous communication system embodying the present invention.

FIG. 1 depicts a parallel asynchronous communication system for transmitting k information bits and a preselected number of redundant bits, and a preselected number of "tail" bits. "Tail" bits are redundant bits, preferably minimum in number, which are added to each ECC codeword to ensure that all codewords are rendered unordered.

As shown in FIG. 1, k information bits are transmitted via a bus 10 to an encoder 11 and encoded by adding (n-k) redundancy bits to output an unordered ECC code of n bits. The n-bit output from encoder 11 is sent via n parallel channels from a transmitter 12 to an asynchronous receiver 13. For each received transition, the asynchronous receiver 13 sends the n bits to a set processor 14.

Set processor 14 comprises a buffer which stores those arrived transitions which are repeated transitions (i.e., already are present) in the current received set but belong to the next codeword (hereinafter referred to as set B in the decoding algorithm). If more than $t_2$ repeated transitions occur and the storage capacity of the buffer for set B in processor 14 is thus exceeded, a circuit 19 will generally initiate an error detection protocol because the $(t_1,t_2)$ constraints have been exceeded and the code is unable to correct the skew errors. Set processor 14 also generates sets of transitions that are not repeated arrivals but belong to the next codeword and arrive prior to the last transition (hereinafter of a then codeword sets A).

In the preferred embodiment, there are only two such sets A: an empty set and a set whose only element is the transition arriving prior to the last one. Then, each set A is subtracted from the current vector for each set A, and the first k bits of the remaining vectors are sent to an encoder 15, which produces (n-k) bits for each of the remaining vectors. These (n-k) bits are sent to a comparator 16.

Encoder 15 encodes the k bits into an unordered code that performs basically the same operation as encoder 11. Comparator 16 compares the n-k bits from set processor 14 with the n-k bits from encoder 15. If they are the same, a circuit 17 is operative to output k information bits from encoder 15 to a bus 20. At the same time, a resetter circuit 18 becomes operative by taking sets A and B from set processor 14, sending A ∪ B, the union of A and B, to the asynchronous receiver 13 as the first received vector, and resetting B as the empty set.

Figure 2:
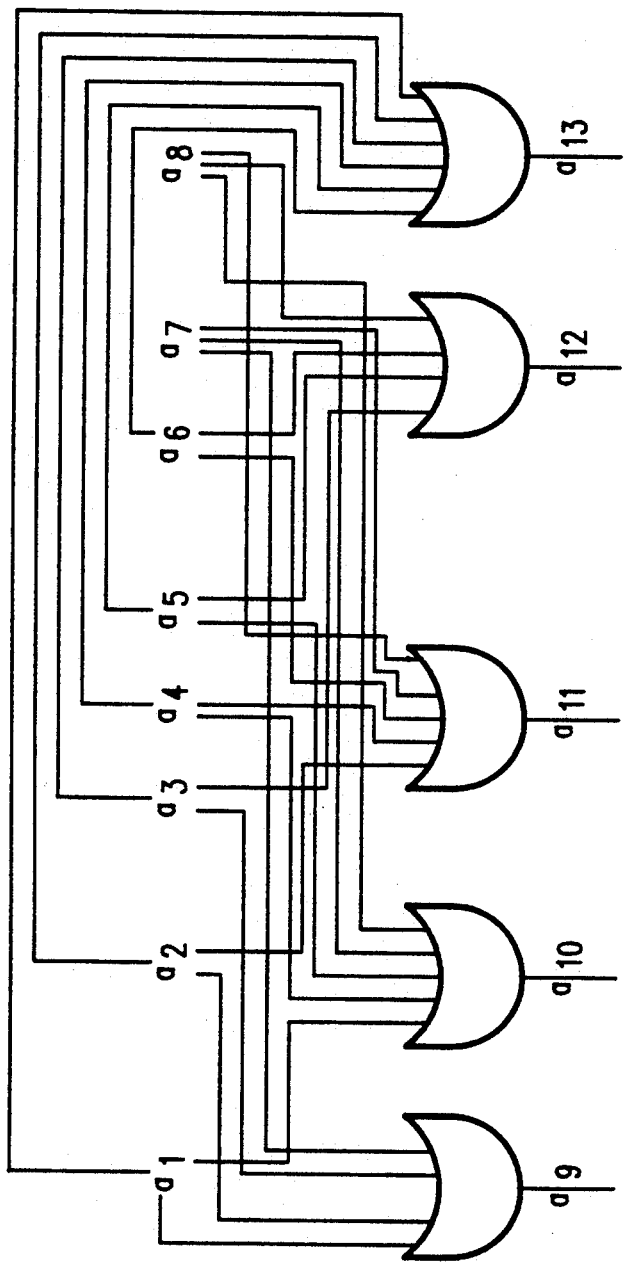
FIG. 2 is a schematic representation of a combinational logic circuit implementation of a portion of an encoder for the preferred embodiment of the invention.

FIG. 2 schematically shows how a combinational logic circuit produces from 8 information bits $a_1-a_8$, 5 redundant bits $a_9-a_{13}$ corresponding to a (13,8,4) Hamming code.

According to the invention, the following coding technique is presented that (1) does not require acknowledgement of a transmission, thereby enabling efficient asynchronous communication on a pipeline basis, and (2) tolerates and corrects up to a preselected number ($t_2$) of transitions that arrive from a second transmission before reception of the complete first transmission, thereby providing skew correction and accommodating up to a preselected amount of variation in channel transmission speeds.

Assume that a vector X is transmitted followed by a vector Y. (It is not expected that many transitions from Y will arrive before the transmission of X has been completed.) Let $t_1$ represent the maximum number of transitions that may remain in X when a transition from Y arrives. Let $t_2$ represent the maximum number of transitions from Y that may arrive before the completion of X. What is needed is a code that can successfully decode X when no skew has occurred but that can detect and correct skew when it does not exceed the two parameters $t_1$ and $t_2$. Such codes will be called $(t_1,t_2)$- tolerant.

A code C is $(t_1,t_2)$-tolerant if and only if, for any pair of codewords X,Y ∈ C (i.e., contained in C), codeword X is transmitted followed by codeword Y, and at least one of the following two conditions is satisfied:

1. $t_1$ is a preselected maximum number of transitions that may be missing from X when a transmission from Y-X arrives (by Y-X is meant the number of transitions in coordinate positions which are in Y but not in X); and 2. $t_2$ is a preselected maximum number of transitions that may arrive from Y-X arrive before all the transitions from X have arrived.

This invention provides a simple criterion that allows the user to decide if a given code is $(t_1,t_2)$-tolerant or not. This criterion also allows the user to construct or select efficient $(t_1,t_2)$-tolerant codes. Applicants' decoding method allows a receiver to recover a transmission successfully when a $(t_1,t_2)$-tolerant code has been used and no skew between transmissions occurs, and corrects skew between transmissions when the $(t_1,t_2)$ constraints are not broken.

Given two binary vectors X and Y of length n, let N(X,Y) denote the number of corresponding coordinates in which X is 1 and Y is 0; for example, if X=10110 and Y=00101, and n=5, then N(X,Y)=2 and N(Y,X)=1. Note that $N(X,Y)+N(Y,X)=d_H(X,Y)$, where $d_H$ denotes the well-known Hamming distance (which for this example is 3).

The following criterion sets forth the requisite conditions for a code to be $(t_1,t_2)$-tolerant:

Assume C is a code and that X and Y are codewords in C. Then C is $(t_1,t_2)$-tolerant if and only if at least one of the following two conditions occurs, where $t = \min\{t_1,t_2\}$:

(a) $\min\{N(X,Y), N(Y,X)\} \geq t+1$; or
(b) $\min\{N(X,Y), N(Y,X)\} \geq 1$ and $\max\{N(X,Y), N(Y,X)\} \geq t_1+t_2+1$.

The user can determine if a given code is $(t_1,t_2)$-tolerant by checking (a) and (b) over all pairs of codewords. By using global constructions, however, this fact can often be proven without the need of going over all possible pairs.

According to the invention, conditions (a) and (b) above can be used to construct or identify efficient $(t_1,t_2)$-tolerant codes. A preferred $(t_1,t_2)$-skew tolerant code can be constructed using a standard error correcting code (ECC) of sufficient word length to accommodate the number of information bits to be transmitted and having a minimum distance between each arbitrary pair of codewords of $(t_1+t_2+t+1)$ using the method (but not the specific code) generically disclosed in the above-identified related application [A].

A $(t_1,t_2)$-tolerant code may also be constructed using error correcting/all unidirectional error detecting (EC-/AUED) codes, such as disclosed in a paper by Blaum and van Tilborg entitled "On t-Error Correcting/All Unidirectional Error Detecting Codes", published in IEEE Transactions on Computers, Vol. C-38, pp. 1493-1501, November 1989.

Use of an identified or constructed $(t_1,t_2)$-tolerant code will permit both detection and correction of a codeword in the asynchronous communication system upon completion of a sequence of transmissions as long as $t_1$ and/or $t_2$ are not exceeded.

Encoding

Any conventional coding method and apparatus may be used to encode the codewords, provided the codewords satisfy the conditions of (a) and/or (b) above. Since the encoding technique forms no part of the present invention, it will not be described in detail. However, a preferred encoding method and apparatus is that disclosed in the above-identified related application [A].

Decoding

Before describing applicants' decoding method, it is necessary to explain the system of notation that will hereinafter be used.

A plurality of n channels can be represented by the numbers 1,2, . . . ,n. When a message transmission begins, the signal levels in each of the n channels are subject to individual time delays. After the m-th transition has arrived, the receiver status is represented by the sequence $X_m = x_1, x_2, \ldots, x_m$ where $1 \leq x_i \leq n$, the number $x_i$ meaning that the i-th transition was received at the $x_i$-th track. The set $(x_1, x_2, \ldots, x_m)$ will be designated as the "support" (i.e., the set of non-zero coordinates) of a vector that determines uniquely a binary vector. From now on, the sequence $X_m = x_1, x_2, \ldots, x_m$ will denote either the sequence as defined above, or a binary vector as defined by its support. Also, X may denote either a vector or its support; for example, if there are six tracks, labeled as 1,2,3,4,5,6 and the initial condition is presumed to be all zeros (i.e., no transitions received), the chronological representation of the six channels in arbitrary time units is as follows:

|  | 1 2 3 4 5 6 |
|---|---|
| INITIAL STATE | 0 0 0 0 0 0 |
|  | 0 = no one level received; initial condition |
| time 1 | 0 0 0 0 1 0 |
|  | vector $X_1 = (5)$ |
| time 2 | 1 0 0 0 1 0 |
|  | vector $X_2 = (5,1)$ |
| time 3 | 1 1 0 0 1 0 |
|  | vector $X_3 = (5,1,2)$ |
| and so on. | | and so on.

Figure 3:
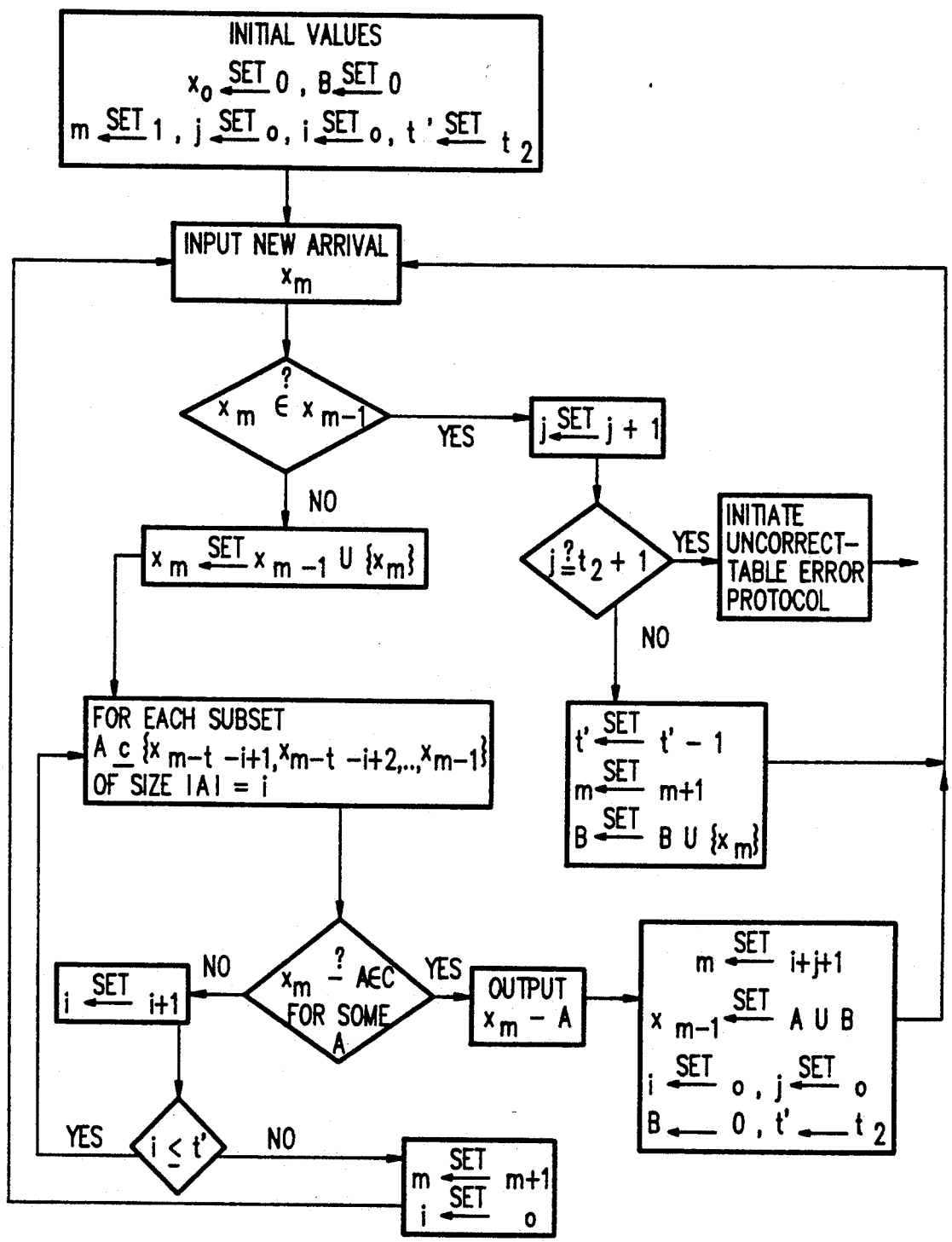
FIG. 3 is a flow chart for a decoding algorithm for implementing the invention.

FIG. 3 is a flow chart setting forth the steps in implementing a decoding algorithm according to the invention for correcting skewed transitions. This algorithm may be expressed as follows:

Set $m \leftarrow 1$, $X_0 \leftarrow \phi$, $i \leftarrow 0$, $B \leftarrow \phi$ and $t' \leftarrow t_2$.
Start: Input $x_m$
If $x_m \in X_{m-1}$, then set $j \leftarrow j+1$.
  If $j = t_2 + 1$, then declare an uncorrectable error and stop.
  Else, set $t' \leftarrow t' - 1$, $m \leftarrow m+1$, $B \leftarrow B \cup \{x_m\}$ and go to START.
Else, $X_m \leftarrow X_{m-1} \cup x_m$
Check: For each $A \subset \{x_{m-t_1-i+1}, x_{m-t_1-i+2}, \ldots, x_{m-1}\}$ of size $|A| = i$, do:
  If $X_m - A \in C$ for some A, then output $X_m - A$.
    Set $m \leftarrow i+j+1$, $X_{m-1} \leftarrow A \cup B$, $i \leftarrow 0$, $j \leftarrow 0$, $B \leftarrow \phi$, $t' \leftarrow t_2$ and go to START.
  Else, if $X_m - A \in C$ for any A, set $i \leftarrow i+1$.
    If $i \leq t'$, then go to CHECK.
    Else, set m to $m+1$, i to 0 and go to START.

The exact implementation of the decoding algorithm depends on the specific code used. Normally, the decoder has to check whether a word or a subset thereof belongs to the code each time that a transition is received. Hence, basically the same circuit used for encoding can be used in the decoding.

EXAMPLE 1

This is a simplified example illustrating how the decoding algorithm operates. Assume that C is a code whose only codewords are $X = 01111$ and $Y = 11000$, resulting in five parallel asynchronous channels. According to the above-defined conditions (a) and/or (b), code C is (1,1)-tolerant.

Assume now that transmitter 12 (FIG. 1) sends the sequence:

2, 3, 4, 5, 1, 2

I.

Assume, however, that receiver 13 receives the sequence:

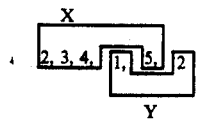

Applying the decoding algorithm step by step to each transition as it arrives, and assuming that i ranges from 0 to $t_2$ (i.e., from 0 to 1), it will be observed that for:

Step 1: Sequence (2) corresponds to 01000, which is not in code C.
Step 2: Sequence (2,3) corresponds to 01100, and sequence (3) corresponds to 00100. Neither is in C.
Step 3: Sequence (2,3,4) corresponds to 01110 and sequence (2,4) corresponds to 01010. Neither is in C.
Step 4: Sequence (2,3,4,1) corresponds to 11110, and sequence (2,3,1) corresponds to 11100. Again, neither is in C.
Step 5: Sequence (2,3,4,1,5) corresponds to 11111, which is not in C; but sequence (2,3,4,5) corresponds to 01111, which is in C. So output 01111 and store set A, which is the 1 in sequence (2,3,4,1,5), as the new received sequence $X_1$.
Step 6: Sequence (1,2) corresponds to 11000, which is in C. Therefore, output 11000.

II.

Assume instead, however, that receiver 13 receives the sequence:

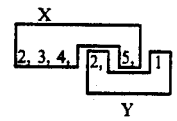

Applying the decoding algorithm step by step to each transition as it arrives, and assuming that i ranges from 0 to $t_2$ (i.e., from 0 to 1), Steps 1, 2, and 3 will be identical with those as described under Section I above. But Steps 4, 5, and 6 will differ slightly as follows:

Step 4: Since 2 is a repeated arrival belonging to the next codeword, store it in set B as {2}.
Step 5: Sequence (2,3,4,5) corresponds to 01111, which is in C. So output 01111 and store set B, which is {2}, as the new received sequence $X_1$.
Step 6: Sequence (2,1) corresponds to 11000, which is in C. So output 11000.

EXAMPLE 2

This example describes in more detail the encoding and decoding of a $(t_1, t_2)$-tolerant code for parallel asynchronous communication with skew correction. Assume eight parallel communication lines capable of transmitting $2^8$ or 256 combinations of binary digits, each of word length 8. Obviously, more information will have to be transmitted (in the form of redundancy) to ensure codeword arrival detection without acknowledgement and for skew correction.

In accordance with the invention, (a) the vector set must be modified by a minimum distance of $t_1 + t_2 + t + 1$ between vectors, and then (b) the vectors must be made unordered so that one vector cannot be contained in another. To provide a (1,1)-tolerant code, a minimum distance of four is required between vectors. This can be achieved by concatenating five additional bits to each original eight-bit word using the following algorithm.

For eight information bits, the following is the ordinary structure of the binary word in sequence from least significant bit to most significant bits:

$$a_1\ a_2\ a_3\ a_4\ a_5\ a_6\ a_7\ a_8$$
(LSB) (MSB)

While a number of error correcting codes may be used, the additional five redundancy bits to be concatenated to each of the 256 eight-bit information words are determined using a standard (13,8) Hamming code formulation as follows:

$$a_9 = a_1 \oplus a_2 \oplus a_3 \oplus a_7;$$

$$a_{10} = a_1 \oplus a_4 \oplus a_5 \oplus a_7 \oplus a_8;$$

$$a_{11} = a_2 \oplus a_4 \oplus a_6 \oplus a_7 \oplus a_8;$$

$$a_{12} = a_3 \oplus a_5 \oplus a_6 \oplus a_8;\ \text{and}$$

$$a_{13} = a_1 \oplus a_2 \oplus a_3 \oplus a_4 \oplus a_5 \oplus a_6,$$

where $\oplus$ is the exclusive OR operator.

To compute the functions for the bits $a_9$-$a_{13}$, the encoder combinational logic diagram of FIG. 2 is used. Each new codeword now contains the original eight information bits and consists of 13 total bits, and each pair of codewords is at a Hamming distance of at least 4.

The (13,8) Hamming code, while interesting, cannot achieve the goals of parallel asynchronous communication skew detection without acknowledgment. The Hamming codes used in a parallel communication arrangement are not capable of detecting or correcting bit skew.

Figure 4:
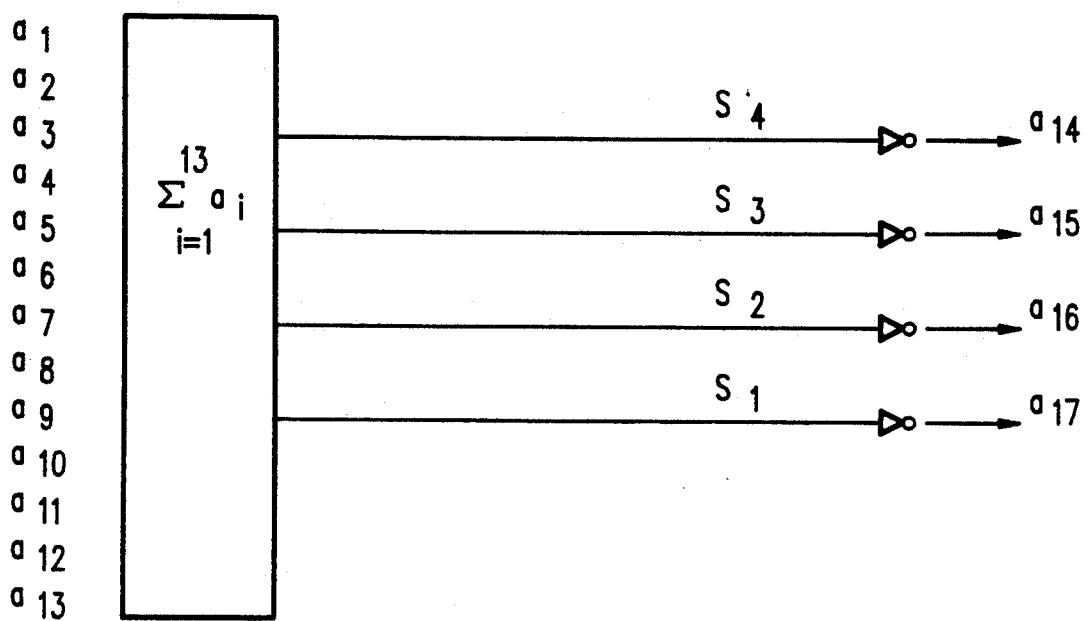
FIG. 4 depicts an encoder logic circuit for one embodiment of the invention.

According to an important feature of the invention, applicants have found that by unordering the (13,8) Hamming code codewords or taking a subset of codewords within a code which are unordered, a suitable $(t_1,t_2)$-tolerant code can be constructed. Berger, in "A Note on Error Detection Codes for Asymetric Channels", Information and Control, Vol. 4, pp. 68-73, 1961, has shown that the addition of a number of tail bits to fixed-weight codewords can produce unordered codewords. Following Berger's teaching, with codewords having a maximum weight of 13, four additional tail bits of information may be concatenated to produce unordered codewords. However, this will require $13+4=17$ parallel communication channels. The corresponding logic circuit is shown in FIG. 4, wherein the four additional bits are $s_1$-$s_4$.

Figure 5:
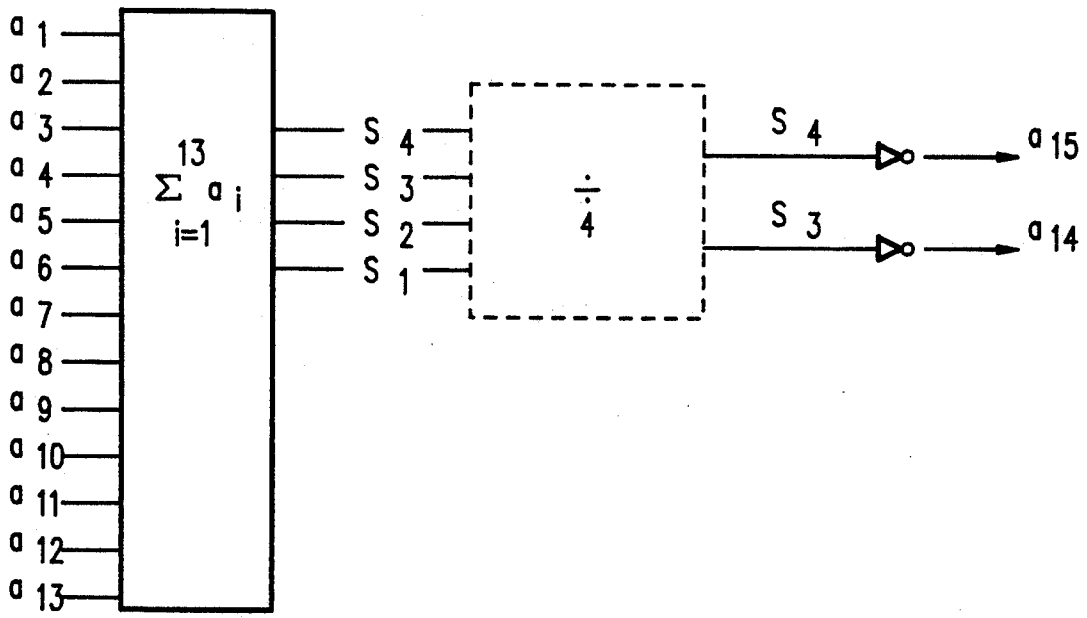
FIG. 5 depicts a modification of the encoder logic circuit of FIG. 4 in accordance with a preferred embodiment of the invention.

Applicants have found that by using the encoder logic circuit implementation illustrated in FIG. 5, only two additional tail bits $s_3,s_4$ (as compared to four when unordering by use of Berger's approach) need be concatenated to the eight information bits plus five redundancy bits which form the minimum distance d of four vector to produce, ultimately, a set of unordered vectors.

This reduction in tail bits is achieved by unordering the vectors by using an unordered error correcting code, such as disclosed in the above-identified related application [A]. This unordering may be achieved by considering a worst case; e.g., a (13,8) Hamming code in which the number of weights is 14. Dividing the weight 14 by the minimum (Hamming) distance 4 gives $$\left\lfloor \frac{14}{4} \right\rfloor = 3,\ \text{which written in base 2 is 11,}$$

where x denotes the integer part function of x. Finally, taking the complement of the weight and dividing it by 4, produces the additional bits $(a_{14},a_{15})$ which will unorder the set.

Thus, the 256 vectors of total length 15, which contain the original eight information bits, have a minimum distance of four and are unordered, and can be generated easily. The obtained code is (1,1)-tolerant.

EXAMPLE 3

This is an example of implementing applicants' invention to detect and correct skew in a system with 256 asynchronously transmitted 15-bit vectors in a parallel communication system.

| | Channel Numbers | | | | | | | | | | | | | | |
|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 |
| X = | 1 | 0 | 1 | 1 | 0 | 1 | 1 | 0 | 1 | 1 | 1 | 0 | 0 | 0 | 1 |
| Y = | 0 | 0 | 1 | 0 | 1 | 0 | 1 | 0 | 0 | 0 | 1 | 0 | 0 | 1 | 0 |

In other words, $X = \{1,3,4,6,7,9,10,11,15\}$ and $Y = \{3,5,7,11,14\}$.

Assume X is transmitted followed by Y over the 15 parallel lines and the received sequence is:

```
           X
 3, 4, 15, 11, 9, 10, 6, 7,  5, 1,   14, 3, 7, 11
                                       Y
```

Let $x_1$-$x_{15}$ be the sequence in which the bits of the codeword arrive; that bits $a_1$-$a_8$ are information bits and bits $a_9$-$a_{15}$ are redundancy bits; and that $X_1$-$X_m$ designate the vectors currently stored in a buffer (not shown) following the arrival of each bit sequence $x_1$-$x_{15}$. Now assume that the initial condition is all 0's; and that each step in the following tabulation represents the arrival of a transition.

```
                    x_1 arrives
           1 2  3 4  5 6  7 8  9  10 11 12 13 14 15
Step 1:    0 0  1 0  0 0  0 0  0  0  0  0  0  0  0
   a_9  = a_1 ⊕ a_2 ⊕ a_3 ⊕ a_7 = 1;
   a_10 = a_1 ⊕ a_4 ⊕ a_5 ⊕ a_7 ⊕ a_8 = 0;
   a_11 = a_2 ⊕ a_4 ⊕ a_6 ⊕ a_7 ⊕ a_8 = 0;
   a_13 = a_1 ⊕ a_2 ⊕ a_3 ⊕ a_4 ⊕ a_5 ⊕ a_6 = 1;
   a_14 = 1; and
   a_15 = 0
   Decision NO; i.e., vector not in the code.
                    x_2 arrives
Step 2a:   0 0  1 1  0 0  0 0  0  0  0  0  0  0  0
   Since a_9 = 1, the decision is NO.
Step 2b:   0 0  0 1  0 0  0 0  0  0  0  0  0  0  0
   This is X_2 − {x_1}
   Since a_9 = 0 and a_10 = 1, the decision is NO.
                    x_3 arrives
Step 3a:   0 0  1 1  0 0  0 0  0  0  0  0  0  0  1
   This is X_3
   Since a_9 = 1, the decision is NO.
Step 3b:   0 0  1 0  0 0  0 0  0  0  0  0  0  0  1
   This is X_3 − {x_2}
```

-continued

```
              Since a9 = 1, the decision is NO.
                       x4 arrives
Step 4a:    0 0  1 1  0 0  0 0  0  0  1  0  0  0  1
            This is X4
            Since a9 = 1, the decision is NO.
Step 4b:    0 0  1 1  0 0  0 0  0  0  1  0  0  0  0
            This is X4 − {x3}
            Since a9 = 1, the decision is NO.
                       x5 arrives
Step 5a:    0 0  1 1  0 0  0 0  1  0  1  0  0  0  1
            This is X5
            Since a9 = 1 and a10 = 1, the decision is NO.
Step 5b:    0 0  1 1  0 0  0 0  1  0  0  0  0  0  1
            This is X5 − {x4}
            Since a9 = 1 and a10 = 1, the decision is NO.
                       x6 arrives
Step 6a:    0 0  1 1  0 0  0 0  1  1  1  0  0  0  1
            This is X6
            Since a9 = 1 and a10 = 1 and a11 = 1 and a12 = 1,
            the decision is NO.
Step 6b:    0 0  1 1  0 0  0 0  0  1  1  0  0  0  1
            This is X6 − {x5}
            Since a9 = 1 and a10 = 1 and a11 = 0,
            the decision is NO.
                       x7 arrives
Step 7a:    0 0  1 1  0 1  0 0  1  0  1  0  0  0  1
            This is X7
            Since a9 = 1 and a10 = 1 and a11 = 0,
            the decision is NO.
Step 7b:    0 0  1 1  0 1  0 0  1  0  1  0  0  0  1
            This is X7 − {x6}
            Since a9 = 1 and a10 = 1, the decision is NO.
                       x8 arrives
Step 8a:    0 0  1 1  0 1  1 0  1  1  1  0  0  0  1
            This is X8
            Since a9 = 0, the decision is NO.
Step 8b:    0 0  1 1  0 0  1 0  1  1  1  0  0  0  1
            This is X8 − {x7}
            Since a9 = 0, the decision is NO.
                       x9 arrives
Step 9a:    0 0  1 1  1 1  1 0  1  1  1  0  0  0  1
            This is X9
            Since a9 = 0, the decision is NO.
Step 9b:    0 0  1 1  1 1  0 0  1  1  1  0  0  0  1
            This is X9 − {x8}
            Since a9 = 0 and a10 = 0, the decision is NO.
                       x10 arrives
Step 10a:   1 0  1 1  1 1  1 0  1  1  1  0  0  0  1
            Since a9 = 1 and a10 = 0, the decision is NO.
Step 10b:   1 0  1 1  0 1  1 0  1  1  1  0  0  0  1,
            which represents X10 − {x9}, where {x9} becomes set A.
            Since a9 = 1; a10 = 1; a11 = 1; a12 = 0; a13 = 0;
            a14 = 0; and a15 1, the decision is YES and the
            output 10110110 (the first 8 bits carry the
            information) is X.
```

Now send A∪B (the union of sets A and B) from processor 14 to receiver 13 as the first vector in the next codeword (set B remains an empty set). As a result, the received sequence will be reset to (5,14,3,7,11). Repeat the process and arrival decoding for Y.

Note again the received sequence

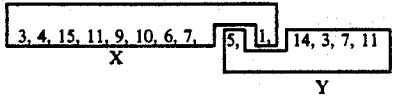

In summary, it will now be apparent that known error correcting codes may be modified to construct a new code having the capability to tolerate and correct up to a preselected number of skewed transitions in parallel asynchronous communication systems operating without acknowledgement.

While the invention has been particularly shown and described with reference to a preferred embodiment thereof, it will be understood by those skilled in the art that various changes in form and details may be made therein without departing from the spirit and scope of the invention. Accordingly, the method and apparatus herein disclosed are to be considered merely as illustrative and the invention is to be limited only as specified in the claims.

We claim:

1. For use in a parallel asynchronous information communication system in which binary electrical signals are transformed and transmitted as unordered ECC codewords in sequences of contemporaneous electrical transitions over n parallel channels without requiring acknowledgement, a decoder comprising:

a set processor for (i) generating sets A from transitions that arrive prior to receipt of a last transition in a then current codeword and are not repeated arrivals but belong in the next following codeword and (ii) storing as a set B up to a preselected number of transitions constituting repeated arrivals of transitions belonging to said next codeword, said set processor also separately outputting as binary electrical signals k information bits and (n-k) redundancy bits from the codewords as received from the channels; and a reset circuit operative when the k information bits are determined to be skew free to release the union of sets A and B from the processor as a first received vector for said next codeword and reset set B to an empty set.

2. The decoder of claim 1, including:

an encoder for encoding the k bits output by the set processor into an unordered ECC codeword with k information bits and (n-k) redundancy bits;

a comparator for issuing a compare signal if the (n-k) bits output by the set processor and by the encoder are equal;

circuitry responsive to the compare signal to output as skew free the k information bits as encoded by the encoder; and wherein said reset circuit is responsive to the compare signal to release the union of sets A and B from the processor and reset set B.

3. The decoder of claim 1, wherein said codewords are selected to provide a $(t_1,t_2)$ skew-tolerant code in which:

$t_1$ is the preselected maximum number of transitions that may be missing from the current codeword when a transition arrives from said next codeword; and $t_2$ is the preselected maximum number of transitions which may arrive from said next codeword before all of the transitions arrive from said current codeword; and at least one of the following conditions occurs for each arbitrary pair of codewords X and Y in the set:

(a) $\min\{N(X,Y), N(Y,X)\} \geq t+1$, or (b) $\min\{N(X,Y), N(Y,X)\} \geq 1$ and $\max\{N(X,Y), N(Y,X)\} \geq t_1+t_2+1$, where $t=\min(t_1,t_2)$, and $N(X,Y)$ is the number of coordinates in which X is 1 and Y is 0.

4. The decoder of claim 1, wherein the codewords are constructed from a standard error correcting code having sufficient word length to accommodate the number of information bits to be transmitted and also having a minimum distance between each arbitrary pair of codewords of $(t_1+t_2+t+1)$.

5. In a parallel asynchronous information communication system for transmitting information as sequences of contemporaneous transitions over n parallel channels without requiring acknowledgement, apparatus for detecting and correcting skewed transitions comprising:

a first encoder for transforming a series of k transitions constituting information bits into sets of unordered ECC codewords, each consisting of k information bits and (n-k) redundancy bits;

an asynchronous receiver;

a transmitter for transmitting the codewords over the n channels to the receiver; and a decoder comprising:

(a) a set processor for (i) generating sets A from transitions that arrive prior to receipt of the last transition in a current codeword and are not repeated arrivals but belong in the next codeword, and (ii) storing as a set B up to a preselected number of transitions constituting repeated arrivals of transitions belonging to said next codeword, said set processor also separately outputting k bits and (n-k) bits of the codeword as received from the channels;

(b) a second encoder for encoding k bits output by the set processor into an unordered ECC codeword with k information bits and (n-k) redundancy bits;

(c) a comparator for issuing a compare signal if the (n-k) bits output by the set processor and by the second encoder are equal;

(d) circuitry responsive to the compare signal to output as skew free the k bits as encoded by the second encoder; and (e) a reset circuit responsive to the compare signal to (i) send back from the processor to the receiver the union of sets A and B as a first-received vector for said next codeword and (ii) reset set B to an empty set.

6. The apparatus of claim 5, wherein the codewords are selected to provide a $(t_1,t_2)$ skew-tolerant code in which:

$t_1$ is the preselected maximum number of transitions that may be missing from the current codeword when a transition arrives from said next codeword; and $t_2$ is the preselected maximum number of transitions which may arrive from said next codeword before all of the transitions arrive from said current codeword; and at least one of the following conditions occurs for each arbitrary pair of codewords X and Y in the set:

(a) $\min\{N(X,Y), N(Y,X)\} \geq t+1$, or (b) $\min\{N(X,Y), N(Y,X)\} \geq 1$ and $\max\{N(X,Y), N(Y,X)\} \geq t_1+t_2+1$, where $t=\min(t_1,t_2)$, and $N(X,Y)$ is the number of coordinates in which X is 1 and Y is 0.

7. The apparatus of claim 5, wherein the codewords are constructed from a standard error-correcting code having sufficient word length to accommodate the number of information bits to be transmitted and also having a minimum distance between each arbitrary pair of codewords of $(t_1+t_2+t+1)$.

8. The apparatus of claim 5, wherein both the first encoder and second encoder comprise:

means for determining the weight of each of the ECC codewords and dividing said weight by the quantity $(t_1+t_2+t+1)$ and generating the integer part thereof expressed in binary representation; and means for complementing the binary representation to produce said redundancy bits.

* * * * *